(12) United States Patent
Miyakawa et al.

(10) Patent No.: US 7,705,455 B2
(45) Date of Patent: Apr. 27, 2010

(54) SEMICONDUCTOR DEVICE

(75) Inventors: Nobuaki Miyakawa, Wako (JP); Takanori Maebashi, Wako (JP); Takahiro Kimura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 177 days.

(21) Appl. No.: 12/064,762

(22) PCT Filed: Aug. 25, 2006

(86) PCT No.: PCT/JP2006/317283

§ 371 (c)(1),
(2), (4) Date: Feb. 25, 2008

(87) PCT Pub. No.: WO2007/024022

PCT Pub. Date: Mar. 1, 2007

(65) Prior Publication Data

US 2009/0160050 A1    Jun. 25, 2009

(30) Foreign Application Priority Data

Aug. 26, 2005    (JP) ............................. 2005-245564

(51) Int. Cl.
*H01L 23/48* (2006.01)
*H01L 23/52* (2006.01)
*H01L 29/40* (2006.01)

(52) U.S. Cl. ...................... 257/737; 257/735; 257/750; 438/455; 438/459

(58) Field of Classification Search .................. 257/73, 257/737, 750, E21.211, E23.015; 438/455, 438/459

See application file for complete search history.

(56) References Cited

U.S. PATENT DOCUMENTS 6,566,736 B1 *    5/2003    Ogawa et al. ................ 257/620

(Continued)

FOREIGN PATENT DOCUMENTS

JP           11261000           9/1999

(Continued)

OTHER PUBLICATIONS

International Search Report dated Nov. 21, 2006 for International Application No. PCT/JP2006/317283 filed Aug. 25, 2006 (3 pages).

(Continued)

*Primary Examiner*—Phuc T Dang
(74) *Attorney, Agent, or Firm*—McCormick, Paulding & Huber LLP

(57) ABSTRACT

A deep isolation trench extending from the main surface of a substrate to a desired depth is formed on the substrate with an insulating film in buried in it to form a through isolation portion. Subsequently, after a MOSFET is formed on the main surface of the substrate, an interlayer insulating film is deposited on the main surface of the substrate. Then, a deep conduction trench extending from the upper surface of the interlayer insulating film to a depth within the thickness of the substrate is formed in a region surrounded by the through isolation portion. Subsequently, a conductive film is buried in the deep conduction trench to form through interconnect portion. Then, after the undersurface of the substrate is ground and polished to an extent not to expose the through isolation portion and the through interconnect portion, wet etching is performed to an extent to expose parts of the lower portion of each of the through isolation portion and the through interconnect portion.

4 Claims, 14 Drawing Sheets

U.S. PATENT DOCUMENTS 6,581,280 B2 * 6/2003 Curcio et al. .................. 29/832
6,884,939 B2 * 4/2005 Dishongh et al. ........... 174/534
6,916,725 B2 7/2005 Yamaguchi
7,291,911 B2 11/2007 Usami

FOREIGN PATENT DOCUMENTS

| JP | 2004228392 | 8/2004 |
|---|---|---|
| JP | 2005072489 | 3/2005 |
| JP | 2005222994 | 8/2005 |

OTHER PUBLICATIONS

Written Opinion of the International Searching Authority dated Nov. 21, 2006 for International Application No. PCT/JP2006/317283 filed Aug. 25, 2006 (4 pages).

* cited by examiner

SEMICONDUCTOR DEVICE

CROSS REFERENCE TO RELATED APPLICATIONS

This application is entitled to the benefit of and incorporates by reference essential subject matter disclosed in International Patent Application No. PCT/JP2006/317283 filed on Aug. 25, 2006 and Japanese Patent Application No. 2005-245564 filed Aug. 26, 2005.

BACKGROUND OF THE INVENTION

1. Field of the Invention

The present invention relates to a semiconductor device manufacturing method, a semiconductor device, and a wafer. More particularly, to a three-dimensional semiconductor device formed by laminating a plurality of semiconductor devices, a method of manufacturing such a three-dimensional semiconductor device and a wafer.

2. Description of the Related Art

Conventionally, a three-dimensional semiconductor integrated circuit device has been known having a structure in which two or more wafers are vertically laminated and are electrically connected therebetween with buried interconnect. For example, Japanese Patent Laid-Open Publication No. H11-261000 (hereinafter referred to as a patent document) discloses a method of manufacturing a three-dimensional semiconductor integrated circuit device. In this method, firstly, a trench (deep trench) is formed on one of wafers to be laminated. Then, after the inside of the trench is thermally oxidized, polysilicon is buried in that trench as a conductor to form buried interconnect. Then, the wafer is made thinner until the buried interconnect is exposed, and an undersurface bump is formed at the position of each of the buried interconnect on the undersurface of the wafer. Then, after laminating the undersurface bumps of the wafer and the top-surface bumps formed on the top surface of the other one of the wafers to be laminated, an insulating adhesive is injected between these two laminated wafers to manufacture a three-dimensional semiconductor integrated circuit device. According to this manufacturing method, undersurface bumps for connection have to be formed on the undersurface of one of two wafers to be laminated, and top-surface bumps for connection have to be formed on the top surface of the other wafer. After these bumps are connected together, an adhesive is injected between the two laminated wafers and hardened, thereby manufacturing a three-dimensional semiconductor integrated circuit device. Further lamination of layers can be achieved by repeating these processes described above.

Here, a process flow of laminating two wafers, upper and lower, is schematically shown in FIG. 1. For formation of an upper wafer, after the wafer is installed, isolation is performed through a normal process to form an element, such as a transistor. Before or after transistor formation, the above-described buried interconnect is formed. In that case, when an insulating film and the buried interconnect are formed at a high buried-interconnect forming temperature, which will affect transistor characteristics (for example, when a deep hole is formed through etching and, after the surface is oxidized, polysilicon is buried as the buried interconnect), a buried interconnect is formed before transistor formation. On the other hand, when the buried-interconnect forming temperature does not affect the transistor characteristics (for example, when a deep hole is formed through etching and, after an insulating film is deposited, a metal interconnect is buried), a buried interconnect is formed after transistor formation. Then, the following processes are sequentially performed: a multilayer interconnect process of connecting the elements, wafer thinning process, a process of forming an undersurface insulating film to prevent a short circuit between the buried interconnect or undersurface bumps later formed and a substrate (silicon), and a process of forming undersurface bumps for connecting buried interconnect of the upper wafer and the lower wafer.

Next, the other one (lower wafer) of the wafers to be laminated is formed by performing processes similar to those for the upper wafer described above until the multilayer interconnect process. That is, the processes are approximately similar to those for the upper wafer except the process of making the wafer thinner, the process of forming an undersurface insulating film, and the process of forming undersurface bumps. However, for the last wafer formed to be laminated, the process of forming a buried interconnect may be omitted. On the top surface of the lower wafer, bumps are formed for connection to the buried interconnect of the upper wafer. Then, position alignment is performed between the upper and lower wafers (alignment between the laminated wafers), the upper and lower wafers are attached together and, furthermore, an adhesive is injected between the wafers to increase mechanical strength of the device.

Meanwhile, when the technology disclosed in the above patent document is used, after a buried interconnect is formed, the wafer is made thinner until the buried interconnect is exposed, and bumps are formed at the position of the buried interconnect on the undersurface of the wafer. When making the wafer thinner, for allowing wafer handling, a glass plate serving as a supporting substrate is bonded on the main surface of the wafer with a adhesive sheet or its alternative, and then the undersurface of the wafer is grinded or polished by using, for example, a grinding device using a grinding stone or a CMP (Chemical Mechanical Polishing) device using slurry for polishing, to make the wafer thinner. However, at the time of grinding the wafer, buried interconnect material or silicon ground by the grinding stone may cause the grinding stone to be clogged. Also, with a long grinding time, the temperature of the grinding stone is increased to cause the wafer to be burnt and cracked. As such, a problem arises in which the wafer to be made thinner is damaged. In recent years, the diameter of the wafer has been increased in view of, for example, increasing the number of chips obtainable from one wafer to enhance manufacturing yields. However, as the diameter of the wafer is increased, it has to take a sufficient amount of time to grind or polish the wafer accordingly. Moreover, in view of ensuring mechanical strength of the wafer, for example, the thickness of the wafer in manufacturing the wafer has to be thicker to some extent. This also increases the time to grind or polish the wafer. Therefore, the problem as described above becomes more significant.

Furthermore, in the technology disclosed in the above patent document, at the time of forming bumps on the undersurface of the wafer to be laminated, in order to insulate the substrate from the bumps, an insulating film is formed on the undersurface of the wafer through, for example, CVD (Chemical Vapor Deposition) or sputtering, after the wafer is made thinner. In this case, however, the processing temperature at the time of forming an insulating film on the undersurface of the wafer is important. That is, in this process, there is a problem in which the thin wafer may be cracked due to the buried interconnect material in the wafer or a film stress of the insulating film attached to the undersurface. Moreover, the insulating film is formed on the undersurface of the wafer in a state where, in view of keeping mechanical strength of the thin wafer, the glass supporting substrate used at the time of wafer thinning is kept attached to the main surface of the wafer. However, the temperature for attaching the insulating film formed on the undersurface of the wafer is higher than the allowable temperature limit of the adhesive sheet for bonding the wafer and the glass substrate. For this reason, a problem arises in which, in the process of forming an insulating film on the undersurface of the wafer, the bonding force of the adhesive sheet is decreased to cause the glass supporting substrate to fall off.

Still further, in the technology disclosed in the above patent document, contact holes have to be formed at positions where bumps are formed on the undersurface of the wafer for connecting the buried interconnects and the bumps. These contact holes are small, and alignment of a photomask for forming these holes is difficult. Moreover, to form bumps on the undersurface of the wafer, cumbersome processes are required, including a series of lithography processing, such as application of a resist, exposure, and development, and etching with a resist pattern formed through the lithography processing as a mask. This poses another problem of increasing the manufacturing time.

SUMMARY OF THE INVENTION

The present invention has been devised in view of the above problems. An object of the present invention is to provide a method capable of avoiding problems in making a wafer thinner and capable of reducing processes for electrical connection between wafers to be laminated.

In order to achieve the above said object, a semiconductor device manufacturing method and a semiconductor device according to the present invention are configured as follows.

That is, the present invention is directed to a semiconductor device manufacturing method of laminating a plurality of wafers and electrically connecting semiconductor circuit units on chips of the wafers together to obtain a desired semiconductor circuit. In the method, forming at least one of the plurality of wafers, forming a first trench in a main surface of the wafer, and then forming a through isolation portion by burying a first insulating film in the first trench; a process of forming an element on the main surface of the wafers comprising the steps of: forming a second trench within a region surrounded by the through isolation portion on the main surface of the wafer, and then forming a through interconnect portion electrically connected to a semiconductor circuit unit of another wafer by burying a conductive film in the second trench; and making the wafer thinner to an extent not to reach to the through isolation portion and the through interconnect portion from an undersurface of the wafer, and then etching until part of the through isolation portion and the through interconnect portion is exposed.

Also, the present invention is directed to a semiconductor device manufacturing method of laminating a plurality of wafers together and electrically connecting semiconductor circuit units on chips of the wafers together to obtain a desired semiconductor circuit, the method comprising the steps of: for a wafer of the wafers that is positioned on an upper side, forming a first trench in a main surface of the wafer positioned on the upper side, and then forming a through isolation portion by burying a first insulating film in the first trench; forming an element on the main surface of the wafer positioned on the upper side; forming a second trench within a region surrounded by the through isolation portion on the main surface of the wafer positioned on the upper side, and then forming a through interconnect portion electrically connected to a semiconductor circuit unit of another wafer by burying a conductive film in the second trench; and exposing parts of the through isolation portion and the through interconnect portion of an undersurface of the wafer positioned on the upper side, wherein the step of laminating the plurality of wafers together includes a step of electrically connecting the semiconductor circuit units of the respective plurality of wafers by jointing the through interconnect portion exposed from the undersurface of the wafer of the plurality wafers that is positioned on the upper side and a bump formed on a main surface of a wafer of the plurality of wafers that is positioned on a lower side, with the through interconnect portion and the bump being in contact with each other.

Furthermore, the present invention is directed to a semiconductor device in which a desired semiconductor circuit is obtained by laminating a plurality of substrates and electrically connecting semiconductor circuit units formed on the respective substrates together, wherein a substrate of the plurality of substrates that is positioned on an upper side has a through interconnect portion penetrating from a main surface to an underside of the substrate and a through isolation portion that is disposed at a position on the main surface of the upper substrate away from the through interconnect portion so as to surround the through interconnect portion and penetrate from the main surface through the undersurface of the upper substrate, a substrate of the plurality of substrates that is positioned at a lower side has a bump on a main surface of the substrate, the bump being electrically connected to a semiconductor circuit unit formed on the substrate on the lower side, and the semiconductor circuit unit of the substrate on the upper side and the semiconductor circuit unit of the substrate on the lower side are electrically connected to each other by jointing the through interconnect portion exposed from the undersurface of the substrate positioned on the upper side with the bump of the main surface of the substrate positioned on the lower side.

According to the present invention, it is possible to provide a method capable of avoiding problems in making a wafer thinner and capable of reducing processes for electrical connection between wafers to be laminated.

DETAILED DESCRIPTION OF THE PREFERRED EMBODIMENT

Preferred embodiments (examples) of the present invention are described below along a flow diagram of FIG. 2 with reference to FIGS. 3 to 19.

A method of manufacturing an upper wafer is first described. FIG. 3 is a cross-section view of main parts of an upper wafer (a wafer of the uppermost layer) 1WA during a manufacturing process. First, the wafer 1WA is prepared (step 100A in FIG. 2). The wafer 1WA is formed of, for example, a thin plate in approximately circular shape. This wafer 1WA forms a substrate 1SA, which is made of, for example, an n-type or p-type single crystal silicon (Si), and has a main surface and an undersurface those are opposite to each other in a thickness direction. Then, trench-shaped isolation portions 2 for isolation are formed on the main surface of the substrate 1SA (that is, the main surface of the wafer 1WA) (step 101A in FIG. 2). Each of the trench-shaped isolation portions 2 is formed by forming an isolation trench 2a on the main surface of the substrate 1SA and then burying an insulation film 2b, such as, for example, silicon oxide ($SiO_2$), in the isolation trench 2a. With these isolation portions 2, an active region of the main surface of the substrate 1SA is defined. Here, an insulating film 3 on the main surface of the active region of the substrate 1SA is made of, for example, silicon oxide formed through, for example, thermal oxidation.

Next, a through isolation portion is formed on the substrate 1SA. First, a resist film is applied on the main surface of the substrate 1SA through, for example, spin coating, and is then exposed and developed (such a series of processes of applying a resist, exposure, and development is referred to as lithography processing). With this, a resist pattern RA is formed on the main surface of the substrate 1SA. The resist pattern RA is formed so as to expose regions where through isolation portions are to be formed and so as to cover the other regions.

Figure 4:
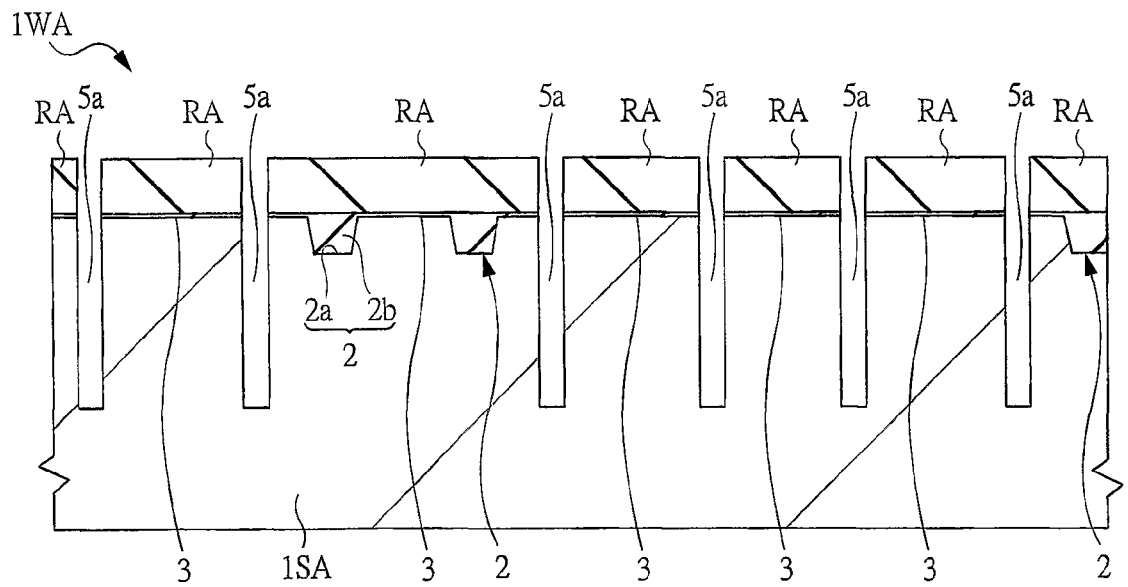
FIG. 4 is a cross-section view of the main parts of the upper wafer during the manufacturing process continued from FIG. 3.

Then, with this resist pattern RA as an etching mask, the insulating film 3 and the substrate 1SA exposed from the etching mask are etched, thereby forming deep isolation trenches (first trenches) 5a on the substrate 1SA, as shown in FIG. 4. FIG. 4 is a cross-section view of the main parts of the upper wafer after the deep isolation trenches 5a are formed. These deep isolation trenches 5a extend from the main surface of the substrate 1SA along a direction (vertically) crossing the main surface (that is, a thickness direction of the substrate 1SA), and are terminated at a position (first position) deeper than the isolation trenches 2a for isolation.

Then, after the resist pattern RA is removed, thermal oxidation is performed on the substrate 1SA, thereby forming an insulating film made of, for example, silicon oxide, on inner surfaces (inner side surfaces and bottom surfaces) of each of the deep isolation trenches 5a. Furthermore, an insulating film made of, for example, silicon oxide or Low-k (low dielectric constant) material, is deposited on the main surface of the substrate 1SA through, for example, CVD (Chemical Vapor Deposition), to be buried in each of the deep isolation trenches 5a.

Then, superfluous portions of the insulating film outside of the deep isolation trenches 5a are removed through an etch-back process using anisotropic dry etching or Chemical Mechanical Polishing (CMP). With this, as shown in FIGS. 5 and 6, through isolation portions 5 are formed (step 102A in FIG. 2).

Figure 5:
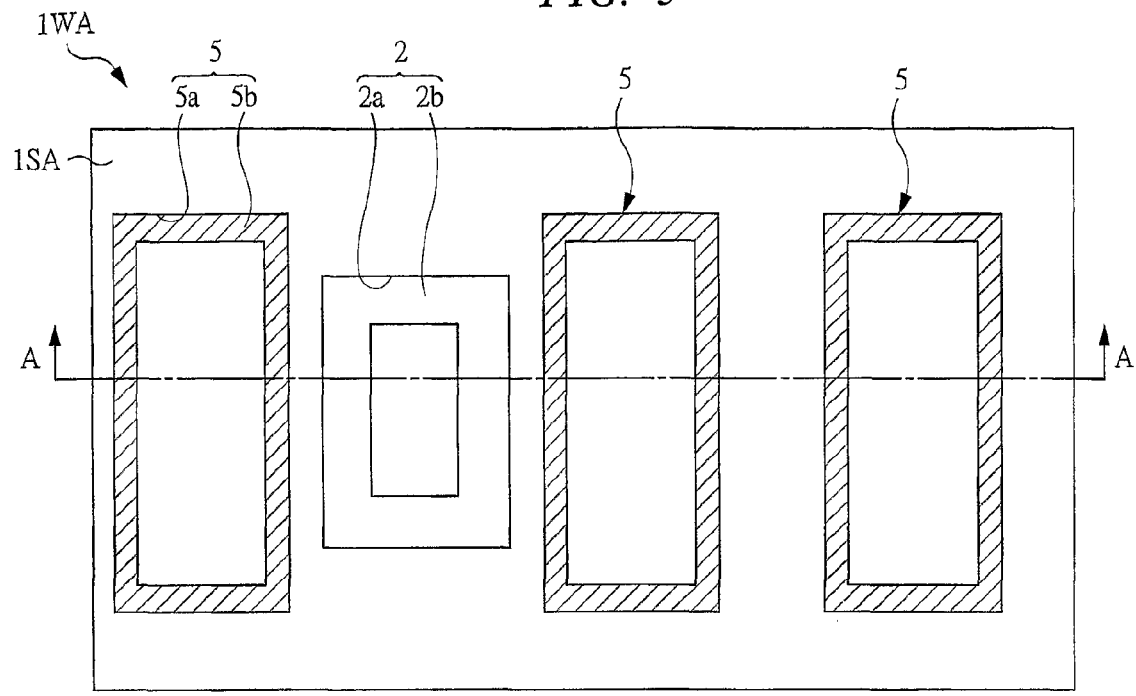
FIG. 5 is a plan view of the main parts of the upper wafer during the manufacturing process continued from FIG. 4.
Figure 6:
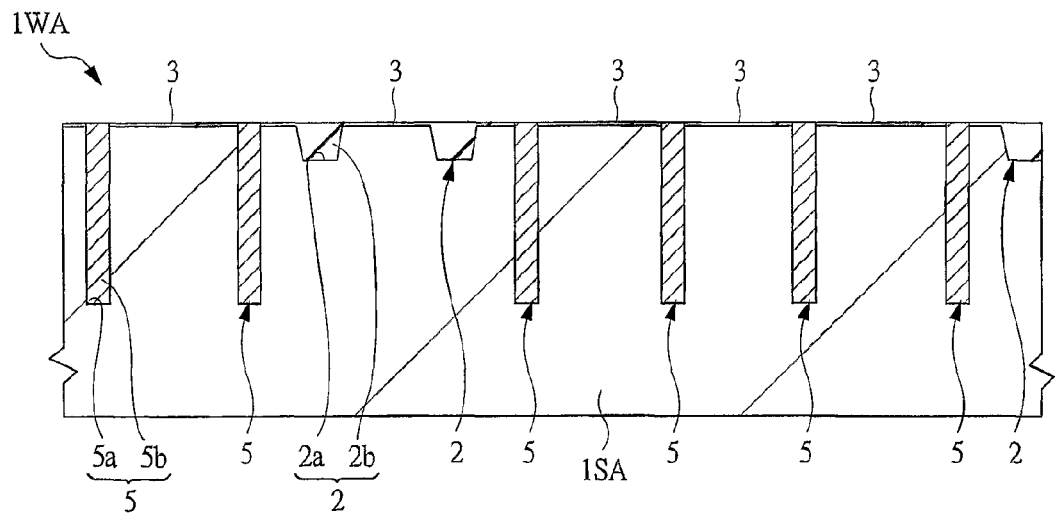
FIG. 6 is a cross-section view along an A-A line in FIG. 5.

FIG. 5 is a plan view of the main parts of the upper wafer 1WA during the manufacturing process continued from FIG. 4, and FIG. 6 is a cross-section view along an A-A line in FIG. 5. Although FIG. 5 is a plan view, this drawing includes hatching on the through isolation portions 5 for ease of viewing. Viewed from the top, the through isolation portions 5 are each formed in a rectangular frame shape, for example. The through isolation portion 5 is formed by burying an insulating film 5b (first insulating film) formed in the above-described manner in the deep isolation trench 5a. The depth of the through isolation portion 5 (that is, the depth of the deep isolation trench 5a) may be deeper than the depth of a through interconnect portion, which will be described further below, or may be equal to or shallower than that. For example, when the dimension of a gap between wafers vertically laminated is controlled with the depth of the through isolation portion 5, the depth of the through isolation portion 5 may be deeper than that of the through interconnect portion. Furthermore, when the dimension of the gap is controlled with the depth of the through interconnect portion, the depth of the through isolation portion 5 may be shallower than the depth of the through interconnect portion. Still further, when the dimension of the gap is controlled with another factor, the depth of the through isolation portion 5 may be equal to that of the through interconnect portion.

Figure 1:
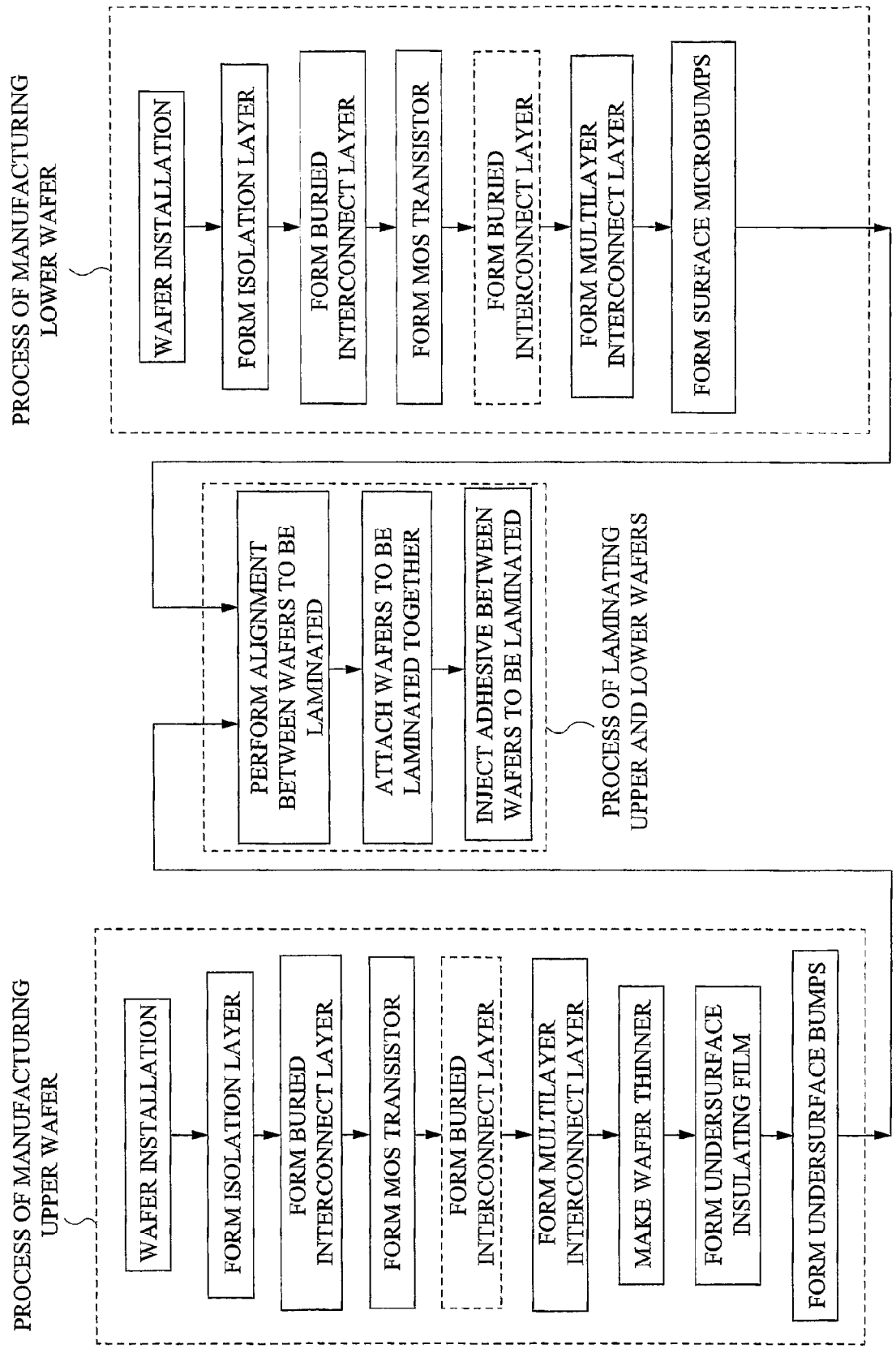
FIG. 1 is a flow diagram of a conventional manufacturing process of laminating two wafers, that is, upper and lower wafers.
Figure 2:
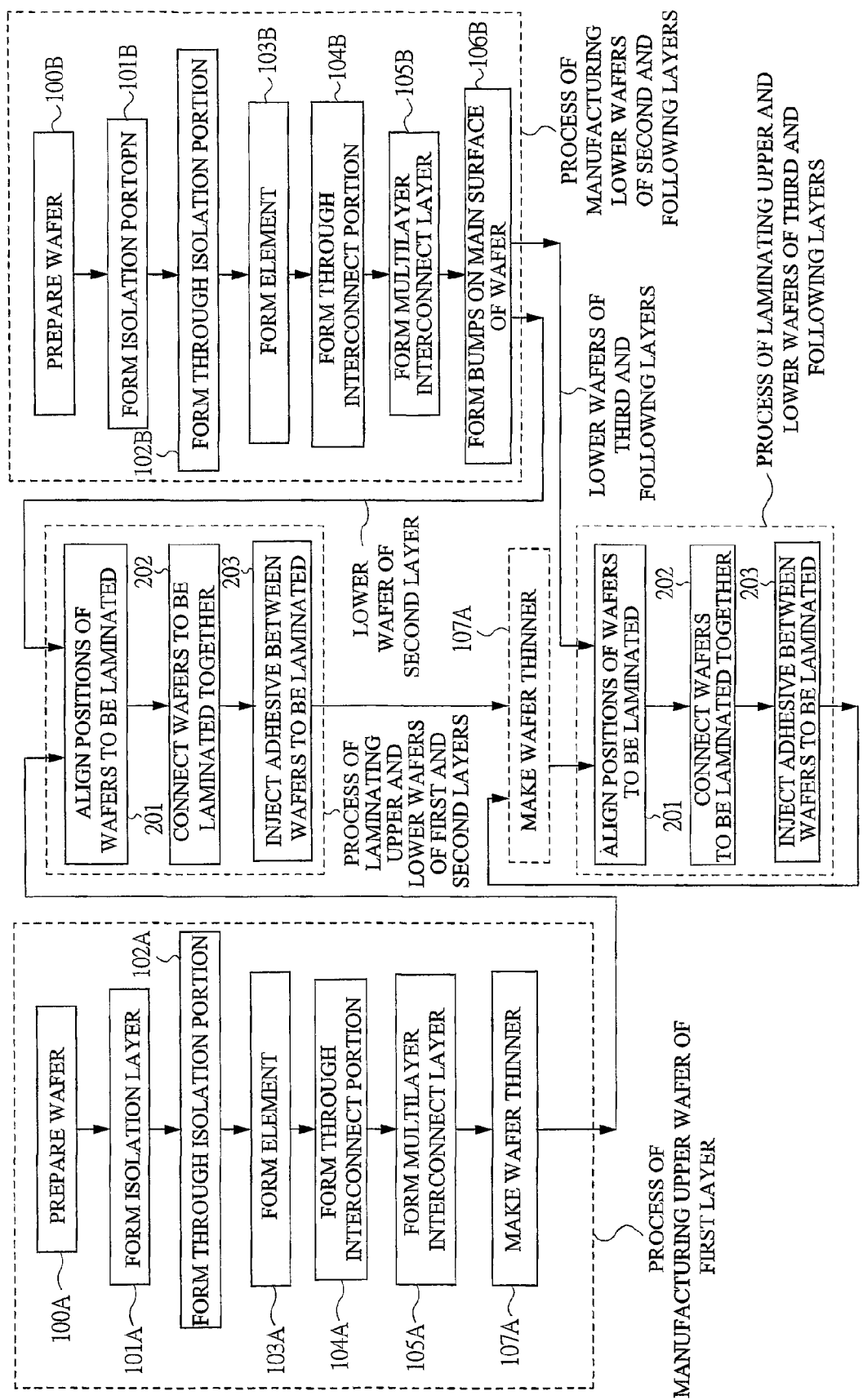
FIG. 2 is a flow diagram of a semiconductor device manufacturing process according to an embodiment of the present invention.
Figure 3:
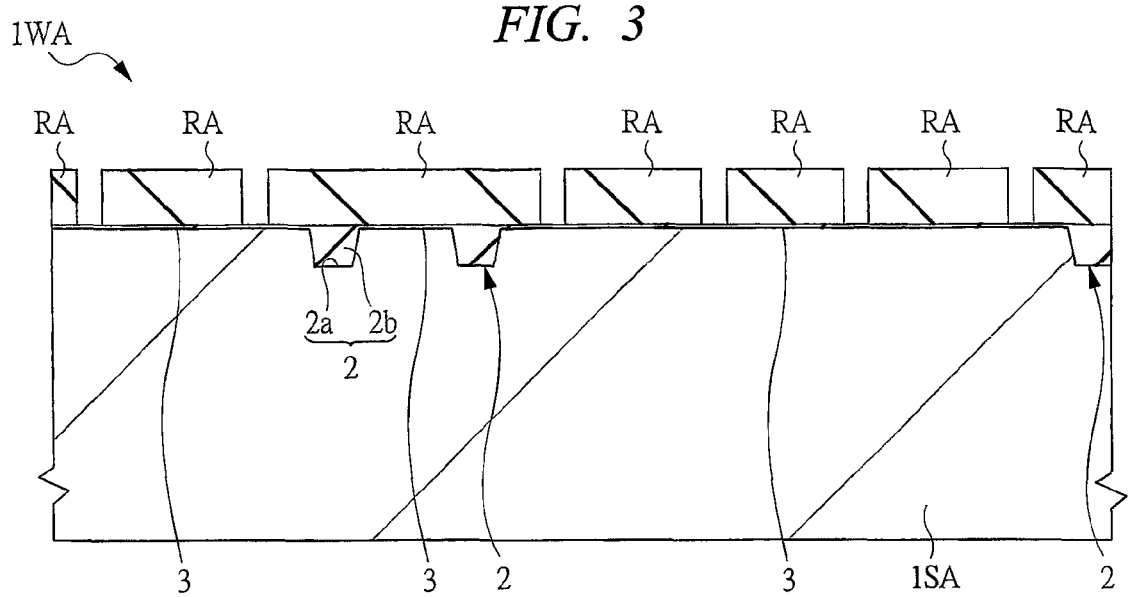
FIG. 3 is a cross-section view of main parts of an upper wafer during a manufacturing process.
Figure 7:
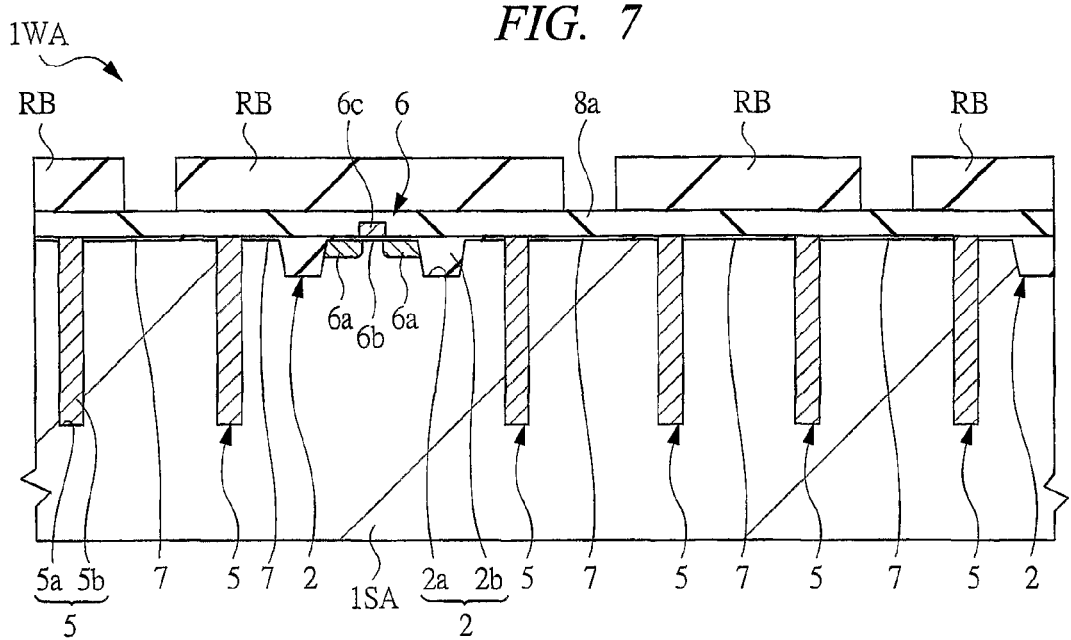
FIG. 7 is a cross-section view of the main parts of the upper wafer during the manufacturing process continued from FIGS. 5 and 6.

Next, after the insulating film 3 is removed, as shown in FIG. 7, an element, such as, for example, a MOSFET (Metal Oxide Semiconductor Field Effect Transistor) 6, is formed in an active region surrounded by the trench-shaped isolation portions 2 of the substrate 1SA (step 103A in FIG. 2). FIG. 7 is a cross-section view of the main parts of the upper wafer 1WA during the manufacturing process continued from FIGS. 5 and 6. The MOSFET 6 has semiconductor regions for source and drain 6a, a gate insulating film 6b, and a gate electrode 6c. The semiconductor regions for source and drain 6a are formed by adding desired impurities (for example, phosphorus (P) or arsenic (As) in the case of an n-channel MOSFET 6, and boron (B) in the case of a p-channel MOSFET 6) to the substrate 1SA. The gate insulating film 6b is made of, for example, silicon oxide, and is formed on the main surface of the substrate 1SA. The gate electrode 6c is made of, for example, low-resistant polysilicon, and is formed on the gate insulating film 6b. Here, an insulating film 7 on the main surface of an active region of the substrate 1SA is formed of, for example, an insulating film made of silicon oxide.

Here, when the through isolation portions 5 are formed after the MOSFET 6 is formed, at the time of thermal oxidation for forming the insulating film 5b of each through isolation portion 5, impurities in the substrate 1SA (the semiconductor regions for source and drain 6a and a channel formation region under the gate electrode 6c) may be diffused again. This may result in variations in electrical characteristics, such as a threshold voltage of the MOSFET 6. By contrast, in the present embodiment, the MOSFET 6 is formed after forming the through isolation portions 5. Therefore, it is possible to avoid variations in electrical characteristics of the MOSFET 6 due to a high processing temperature at the time of forming the through isolation portions 5. Thus, reliability of the semiconductor device can be increased. Here, in place of the MOSFET 6, another active element, for example, a bipolar transistor or a diode, may be formed. Also, in place of the MOSFET 6, a passive element, such as, for example, a resistor (a diffused resistor or a polysilicon resistor), a capacitor, and an inductor, may be formed.

Figure 8:
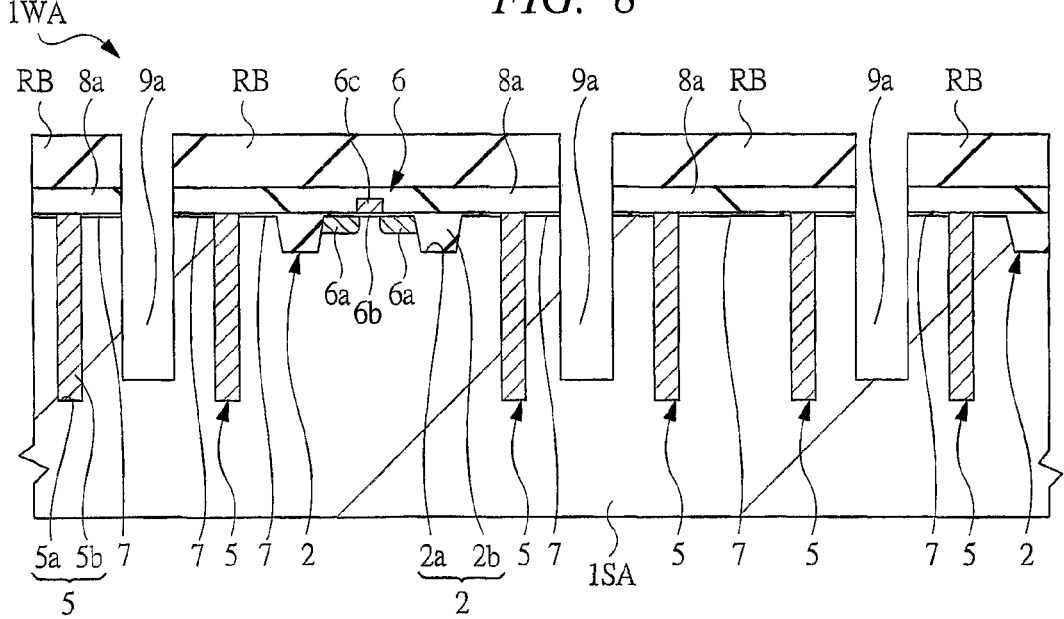
FIG. 8 is a cross-section view of the main parts of the upper wafer during the manufacturing process continued from FIG. 7.

Next, the through interconnect portions are formed. First, an insulating film made of, for example, silicon oxide, is deposited on the main surface of the substrate 1SA through, for example, CVD, and then the upper surface of the insulating film is planarized, thereby forming an interlayer insulating film (second insulating film) 8a. The MOSFET 6, the through isolation portions 5, the trench-shaped isolation portions 2 and others are covered by the interlayer insulating film 8a. Then, a resist pattern RB is formed on the interlayer insulating film 8a through the above-described lithography processing. The resist pattern RB is formed so as to expose regions where the through interconnect portions to be formed and so as to cover the other regions. Then, with this resist pattern RB as an etching mask, the interlayer insulating film 8a, the insulating film 7, and the substrate 1SA exposed from the etching mask are etched, thereby forming deep conduction trenches (second trenches) 9a in the substrate 1SA, as shown in FIG. 8. FIG. 8 is a cross-section view of the main parts of the upper wafer 1WA after the deep conduction trenches 9a are formed. These deep conduction trenches 9a extend from the upper surface of the interlayer insulating film 8a along a direction (vertically) crossing the upper surface (that is, a thickness direction of the substrate 1SA), and are terminated at a position (second position) deeper than the isolation trenches 2a for isolation. The depth of the deep conduction trenches 9a is to be as described in the description about the depth of the through isolation portion 5. Here, by way of example, the depth of the deep conduction trench 9a (second position) is shallower than the depth of the deep isolation trench 5a (first position).

Then, after the resist pattern RB is removed, a barrier conductive film made of, for example, titanium nitride, is deposited on the main surface of the substrate 1SA through, for example, sputtering. Furthermore, a main conductive film made of, for example, tungsten, is deposited through, for example, CVD, to be buried in each of the deep conduction trenches 9a. This barrier conductive film is formed so as to cover the side and bottom surface of the main conductive film, and is in direct contact with the substrate 1SA through inner surfaces (inner side surfaces and bottom surfaces) of each of the deep conduction trenches 9a. The thickness of the barrier conductive film is thinner than the thickness of the main conductive film.

Figure 9:
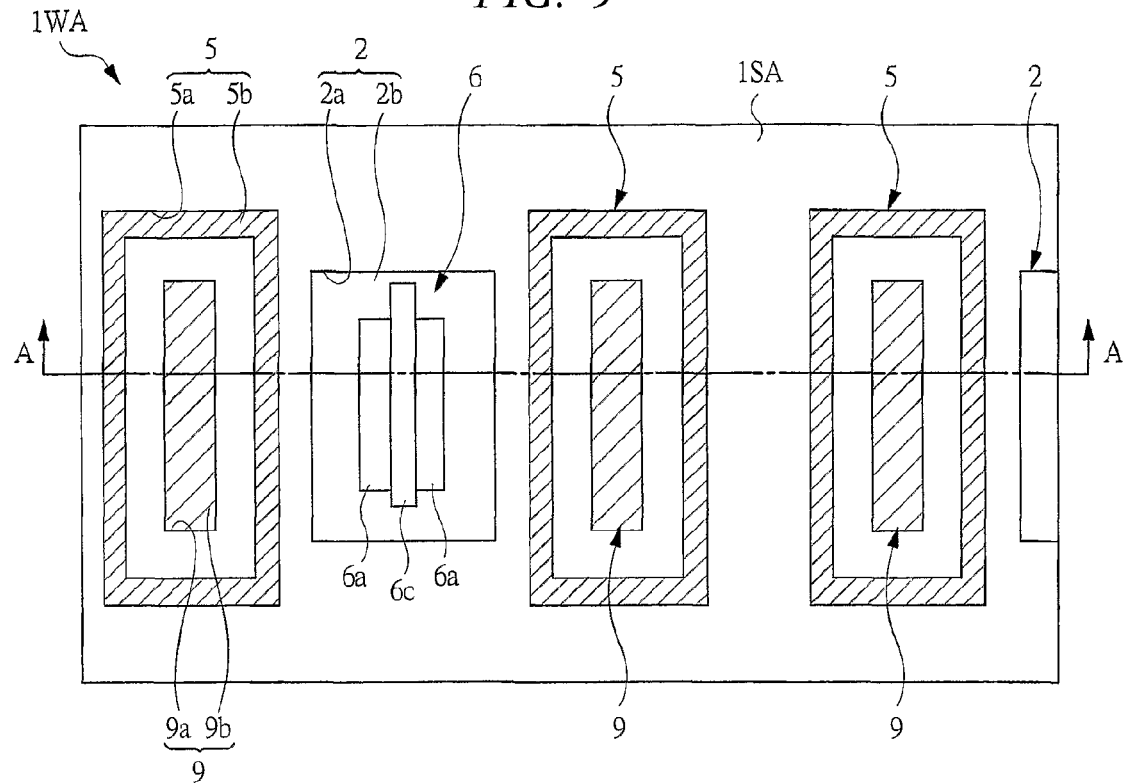
FIG. 9 is a plan view of the main parts of the upper wafer during the manufacturing process continued from FIG. 8.
Figure 10:
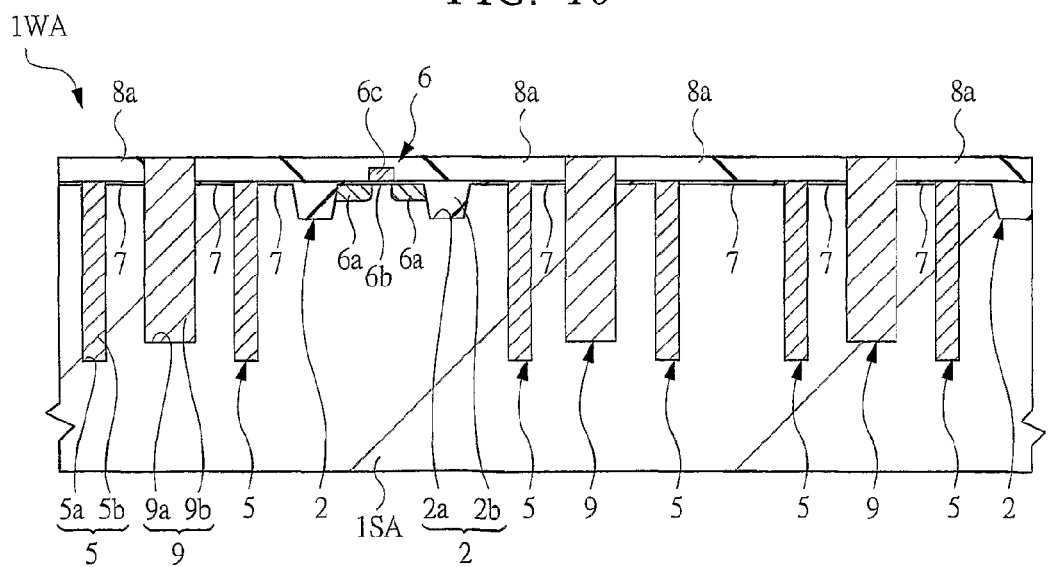
FIG. 10 is a cross-section view along an A-A line in FIG. 9.

Then, the main conductive film and the barrier conductive film are polished through, for example, CMP. With this, as shown in FIGS. 9 and 10, superfluous portions of the main conductive film and the barrier conductive film outside of the deep conduction trenches 9a are removed, thereby causing the main conductive film and the barrier conductive film to be left only in the deep conduction trenches 9a. With this, the through interconnect portions 9 are formed in the deep conduction trenches 9a (step 104A in FIG. 2).

FIG. 9 is a plan view of the main parts of the upper wafer 1WA during the manufacturing process continued from FIG. 8, and FIG. 10 is a cross-section view along an A-A line in FIG. 9. Although FIG. 9 is a plan view, this drawing includes hatching on the through isolation portions 5 and the through interconnect portions 9 for ease of viewing. Viewed from the top, the through interconnect portions 9 are each formed in an elongated rectangular shape, for example. Each of the through interconnect portions 9 is placed in the frame of the through isolation portion 5 in a state of being separated from the through isolation portion 5. That is, the through interconnect portion 9 is placed so as to be surrounded by the through isolation portion 5 placed at a desired distance away from the through interconnect portion 9.

The through interconnect portion 9 is formed by burying a conductive film (the barrier conductive film and the main conductive film) 9b in the deep conduction film 9a. That is, since the through interconnect portion 9 is made of metal, in comparison with the case where the through interconnect portion 9 is made of low-resistant polysilicon, electric resistance of the through interconnect portion 9 can be significantly reduced. In particular, in the present embodiment, since the shape of the through interconnect portion 9 viewed from the top is a large rectangle, the deep conduction trench 9a can be easily processed, and a large volume of the through interconnect portion 9 can be ensured, thereby making it possible to further reduce electric resistance of the through interconnect portion 9. Also, the upper surface of each of the through interconnect portions 9 coincides with the upper surface of the interlayer insulating film 8a. With this, flatness of the upper surface of the interlayer insulating film 8a can be ensured.

Furthermore, if the through isolation portion 5 and the through interconnect portion 9 are integrated together, these portions have to be formed in the same process. Therefore, when the through isolation portions 5 are formed before element formation in order to avoid variations in element characteristics as described above, the through interconnect portions 9 also have to be formed before element formation. However, if the through interconnect portions 9 are formed before element formation, there is a problem of high possibly of causing deterioration in element characteristics and metal contamination. To get around this problem, in the present embodiment, the through isolation portions 5 and the through interconnect portions 9 can be separately formed, and the through interconnect portions 9 can be formed after the MISFET 6 and the interlayer insulating film 8a are formed. Therefore, the possibility of causing deterioration in element characteristics and metal contamination can be further reduced. Thus, electric characteristics of the element can be improved.

The number of through interconnect portions 9 in each of the through isolation portions 5 is not restricted to one. For example, a plurality of through interconnect portions 9 may be placed in the frame of one through isolation portion 5. Also, the planer shape of the through isolation portion 5 is not restricted to that shown in the example of FIG. 9. For example, another shape, such as a square, may suffice.

Figure 11:
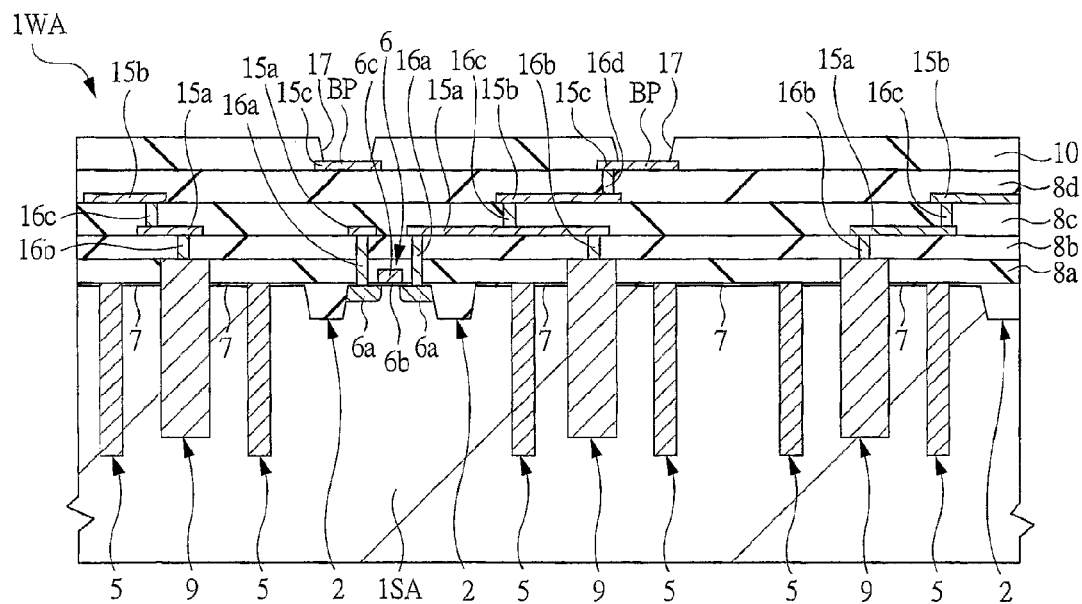
FIG. 11 is a cross-section view of the main parts of the upper wafer during the manufacturing process continued from FIGS. 9 and 10.

Next, as shown in FIG. 11, a multilayer interconnect layer is formed on the main surface of the substrate 1SA through a normal interconnect formation method in a semiconductor device (step 105A in FIG. 2). FIG. 11 is a cross-section view of the main parts of the upper wafer 1WA during the manufacturing process continued from FIGS. 9 and 10. Reference numerals 8b, 8c, and 8d denote interlayer insulating films, a reference numeral 10 denotes a surface protective film, reference numerals 15a, 15b, and 15c denote wires, reference numerals 16a, 16b, 16c, and 16d denote plugs.

The interlayer insulating films 8b, 8c, and 8d are made of, for example, silicon oxide. The wires 15a to 15c and the plugs 16a to 16d are made of metal, such as tungsten (W), aluminum (Al), or copper (Cu). The wire 15a on a first layer is electrically connected to the semiconductor region for source and drain 6a and the gate electrode 6c of the MOSFET 6 through the plug 16a, and also electrically connected to the through interconnect portion 9 through the plug 16b. The surface protective film 10 is formed of, for example, a single silicon oxide film, or a laminated film of silicon oxide and a silicon nitride film deposited thereon. Part of this surface protective film 10 has formed thereon openings 17 from each of which a part of the wire 15c on a third layer is exposed. The portion of each wire 15c exposed from the opening 17 when viewed from the top is denoted as a bonding pad (hereinafter referred to as a pad) BP, although this portion seems identical to other portions of the wire 15c in the drawing. Here, although not shown in FIG. 11, after the process of forming a multilayer interconnect layer, bumps may be formed so as to be connected to the pads BP on the main surface of the wafer 1WA.

Figure 12:
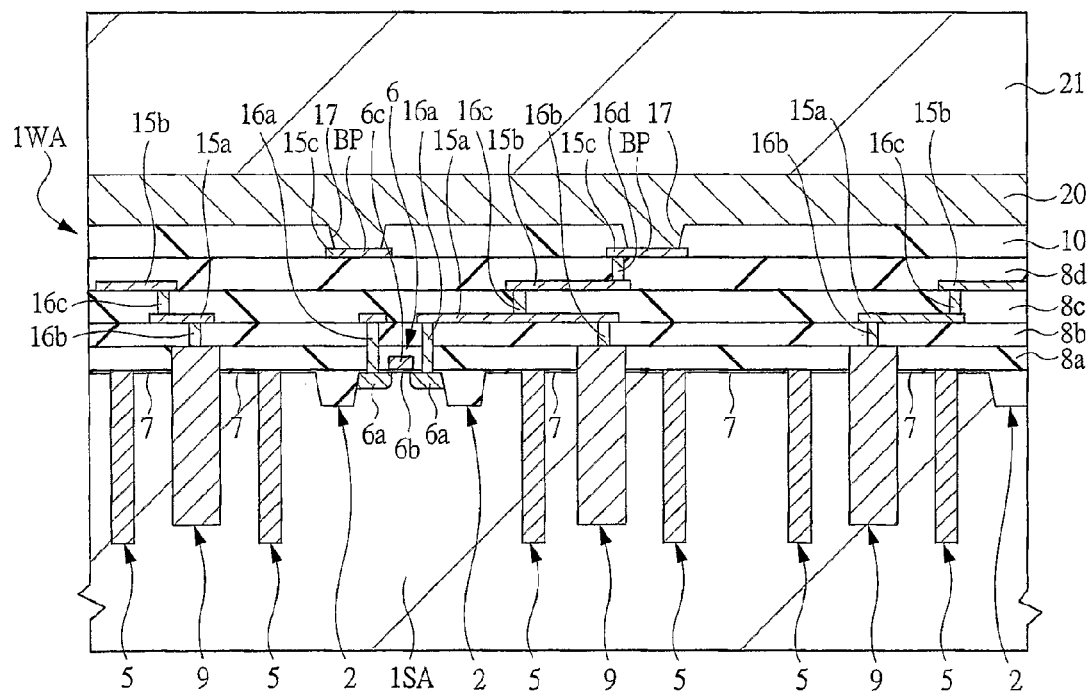
FIG. 12 is a cross-section view of the main parts of the upper wafer during the manufacturing process continued from FIG. 11.

Next, as shown in FIG. 12, a glass supporting substrate 21 is laminated on the main surface of the wafer 1WA interposing an adhesive sheet 20 therebetween. FIG. 12 is a cross-section view of the main parts of the upper wafer 1WA during the manufacturing process continued from FIG. 11. As such, with the glass supporting substrate 21 being laminated on the main surface of the wafer 1WA, handling of the wafer 1WA can be stabilized. Also, mechanical strength of the thin wafer 1WA after the later process of making the film thinner can be ensured.

Next, the wafer 1WA is made thinner (step 107 in FIG. 2). The process of making the wafer 1WA thinner according to the present embodiment includes a first thinning process, a second thinning process, and a third thinning process as follows.

Figure 13:
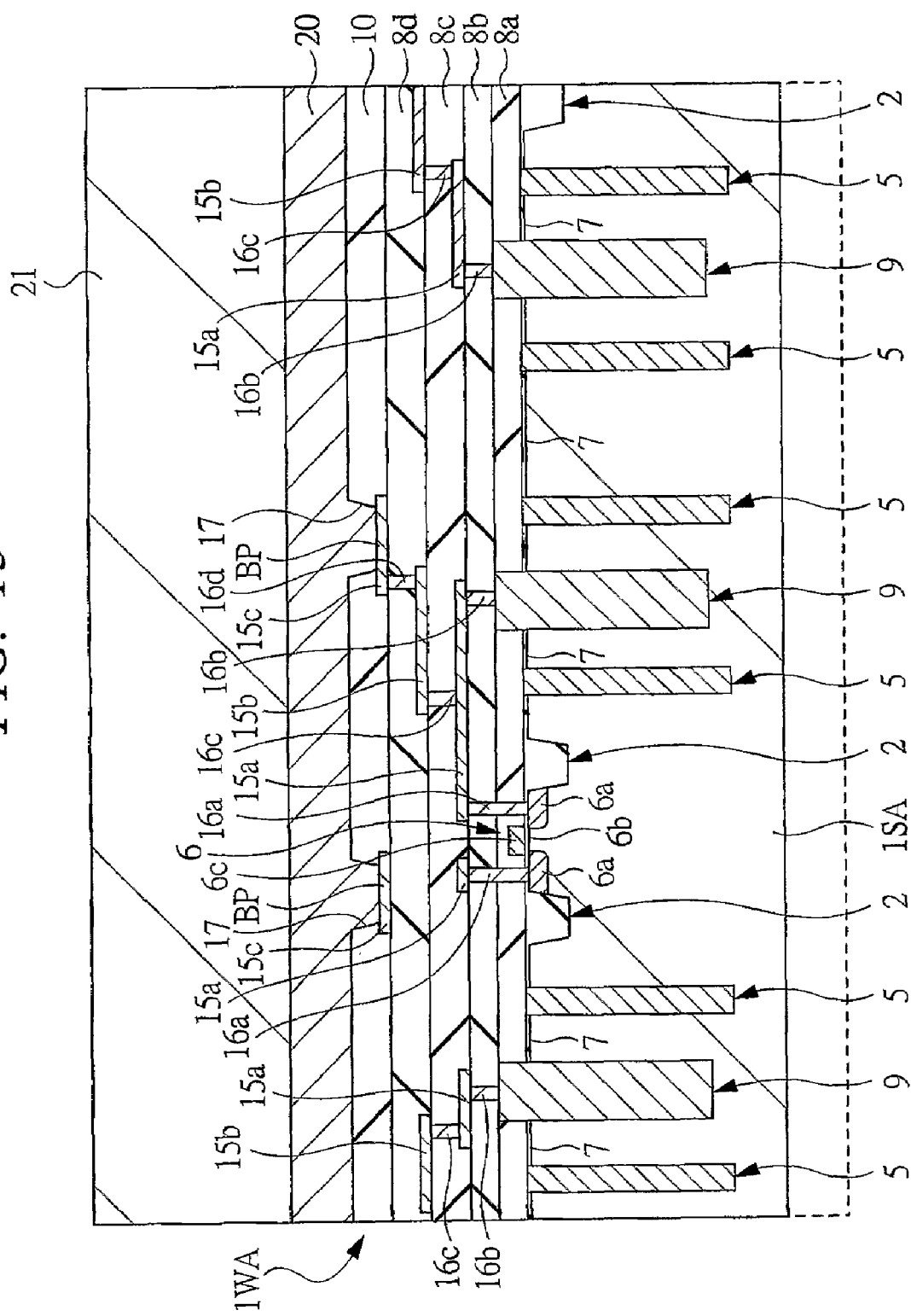
FIG. 13 is a cross-section view of the main parts of the upper wafer after first and second thinning processes continued from FIG. 12.

First, in the first thinning process, as shown in FIG. 13, with the glass supporting substrate 21 being attached to the main surface of the wafer 1WA, the undersurface of the wafer 1WA (that is, the undersurface of the substrate 1SA) is ground so as to have a desired thickness. Also, after this grinding, as the second thinning process, a polishing process may be performed on the undersurface of the wafer 1WA. This polishing process is a thinning process with mechanical and chemical elements, for example, CMP. With this, a damaged layer on the undersurface of the wafer 1WA through the grinding process can be removed, and also the undersurface of the wafer 1WA can be smoothed, thereby making chemical stability in the undersurface of the wafer 1WA uniform. Therefore, in etching to be performed later on the undersurface portion of the wafer 1WA, it is possible to ensure a uniform amount of etching removal in a thickness direction of the wafer 1WA on the entire undersurface of the wafer 1WA. FIG. 13 is a cross-section view of the main parts of the upper wafer 1WA after such first and second thinning processes. A dotted line represents the substrate 1SA before the first thinning process. A main object of these first and second thinning processes is to reduce time for a wafer thinning process. The first thinning process is a thinning process with a mechanical element typified by grinding, whilst the second thinning process is a thinning process with mechanical and chemical elements typified by polishing. These first and second thinning processes end in the state where the through isolation portions 5 and the through interconnect portions 9 are not reached (that is, the through isolation portions 5 and the through interconnect portions 9 are not exposed from the undersurface of the wafer 1WA).

Figure 14:
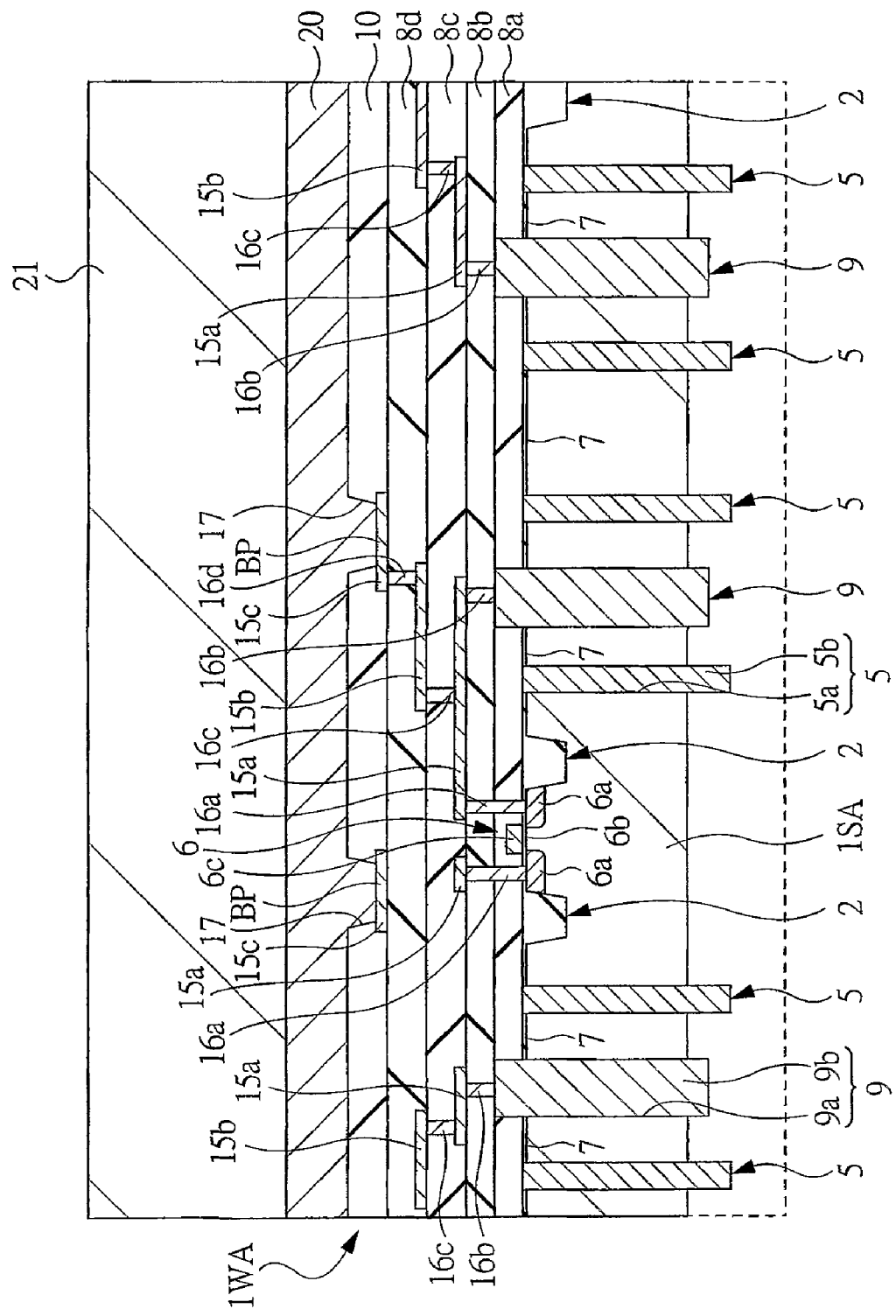
FIG. 14 is a cross-section view of the main parts of the upper wafer after a third thinning process continued from FIG. 13.

Then, in the third thinning process, as shown in FIG. 14, with the glass supporting substrate 21 being attached to the main surface of the wafer 1WA, the undersurface of the wafer 1WA is soaked into a chemical solution and is then etched (wet etching), thereby exposing part of the through isolation portions 5 and the through interconnect portions 9 from the undersurface of the wafer 1WA. FIG. 14 is a cross-section view of the main parts of the upper wafer 1WA after the third thinning process. A dotted line represents the substrate 1SA before the third thinning process. The third thinning process is a thinning process with a chemical element typified by wet etching. A main object of the third thinning process is to prevent burns and damages of the wafer 1WA at the time of thinning process. Here, part of a lower portion of each of the through interconnect portions 9 protrudes from the undersurface of the wafer 1WA for a predetermined length. The protruding length of each through interconnect portion 9 from the undersurface of the wafer 1WA is determined so as to avoid inconveniences in consideration of later processes. With this process, the through interconnect portions 9 are isolated from the substrate 1SA by the through isolation portions 5 in a side-surface direction. The lower portion of each through interconnect portion 9 is isolated from the substrate 1SA with the through interconnect portion 9 being exposed. Thus, the through interconnect portions are fully isolated from the substrate 1SA. Here at this state, the deep isolation trenches 5a and the deep conduction trenches 9a serve as holes penetrating through the main surface and the undersurface of the substrate 1SA. Also, in the above example, in the process of thinning the wafer 1WA, the case of sequentially performing the first thinning process (grinding) and the third thinning process (etching) and the case of sequentially performing the first thinning process (grinding), the second thinning process (polishing), and the third thinning process (etching) have been described. Alternatively, for example, by sequentially performing the second thinning process (polishing) and the third thinning process (etching), the wafer 1WA can also be made thinner.

According to the above-described thinning processes, with the combined use with wet etching, burns and damages of the wafer 1WA occur in the case of making the wafer 1WA thinner through only grinding and polishing can be suppressed or prevented. In particular, when the wafer 1WA is made thinner only through grinding and polishing, a large diameter of the wafer 1WA is required. Larger the wafer 1WA is, longer the time for grinding is required, resulting in an increase in wafer temperature. Also, when a hard material is used for the through interconnect portions 9, the through interconnect material and silicon ground at the time of grinding may cause the grinding stone to be clogged and may increase the wafer temperature. By contrast, as in the present embodiment, by combined use with wet etching in the process of thinning the wafer 1WA, it is possible to avoid a significant increase in wafer temperature in the process of thinning the wafer 1WA even if the diameter of the wafer 1WA is large and a hard material is used as for the through interconnect portions 9. Therefore, burns and damages of the wafer 1WA can be suppressed or prevented. On the other hand, in the thinning processes, the wafer 1WA is made thinner not only through etching but also with the combined use with grinding and polishing, the thinning process time can be reduced compared with the case of removing the undersurface portion of the wafer 1WA only through etching.

In this manner, the process of manufacturing the upper wafer 1WA ends. As such, in the present embodiment, no insulating film is deposited on the undersurface of the wafer 1WA or no bump forming process is required. Therefore, the following effects can be achieved.

First, since a process of depositing an insulating film on the undersurface of the wafer 1WA is not performed, problems due to the processing temperature at the time of depositing an insulating film can be avoided. That is, a problem can be avoided in which the thin wafer is cracked due to the buried interconnect material in the wafer or a film stress of the insulating film. Also, another problem can be avoided in which, in the process of depositing an insulating film on the undersurface of the wafer, the adhesion force of the adhesive sheet 20 for the glass supporting substrate 21 is decreased to cause the glass supporting substrate 21 to fall off. Therefore, since there is no temperature restriction at the time of selecting a material of the adhesive sheet 20, the range of selection for the adhesive sheet 20 can be widened.

Second, since a process of forming bumps on the undersurface of the wafer 1WA is not performed, problems in bump formation can be avoided. That is, it is possible to eliminate a process of forming a small contact hole on the insulating film on the undersurface of the wafer or a process of forming bumps on the undersurface of the wafer, thereby eliminating, for example, lithography processing accompanied with many difficult processes. Therefore, the semiconductor device manufacturing process can be simplified, and the manufacturing time can be reduced. Also, reliability and yields of the semiconductor devices can be improved.

Next, a process of manufacturing a lower wafer is described. Here, a process of manufacturing, as a lower wafer, a wafer of the lowermost layer with its undersurface not supposed to be laminated with another wafer is described. This process of manufacturing a lower wafer is, as shown in the right side of FIG. 2, approximately similar to the process of manufacturing the upper wafer 1WA shown in the left side of FIG. 2. That is, wafer preparation (step 100B), isolation portion formation (step 101B), element formation (step 103B), multilayer interconnect layer formation (step 105B), and bump formation on the main surface of the wafer (step 106B) are sequentially performed. Here, what are different are a bump formation process (step 106B) performed after a process of forming a multilayer interconnect layer (step 105B) and for the lowermost wafer, none of wafer thinning process, process of forming through isolation portions (step 102B) and process of forming through interconnect portions (step 104B) is performed.

Figure 15:
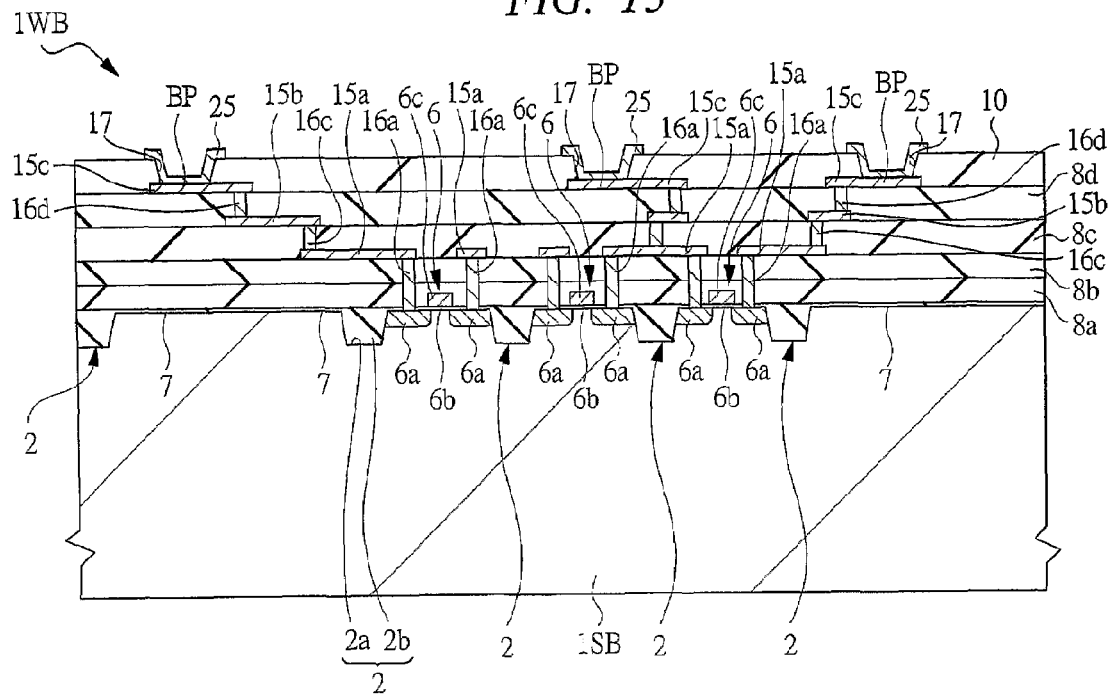
FIG. 15 is a cross-section view of main parts of a lower wafer at a stage of a bump forming process.

FIG. 15 is a cross-section view of main parts of a lower wafer (a wafer of the lowermost layer) 1WB at a stage of a bump forming process 106B after steps from 100B to 105B in FIG. 2. The configuration of the wafer 1WB is approximately similar to that of the upper wafer 1WA shown in FIG. 11 after the step 105A. From the undersurface of the wafer 1WB (that is, the undersurface of the substrate 1SB), the through isolation portions 5 and the through interconnect portions 9 are not exposed.

Figure 16:
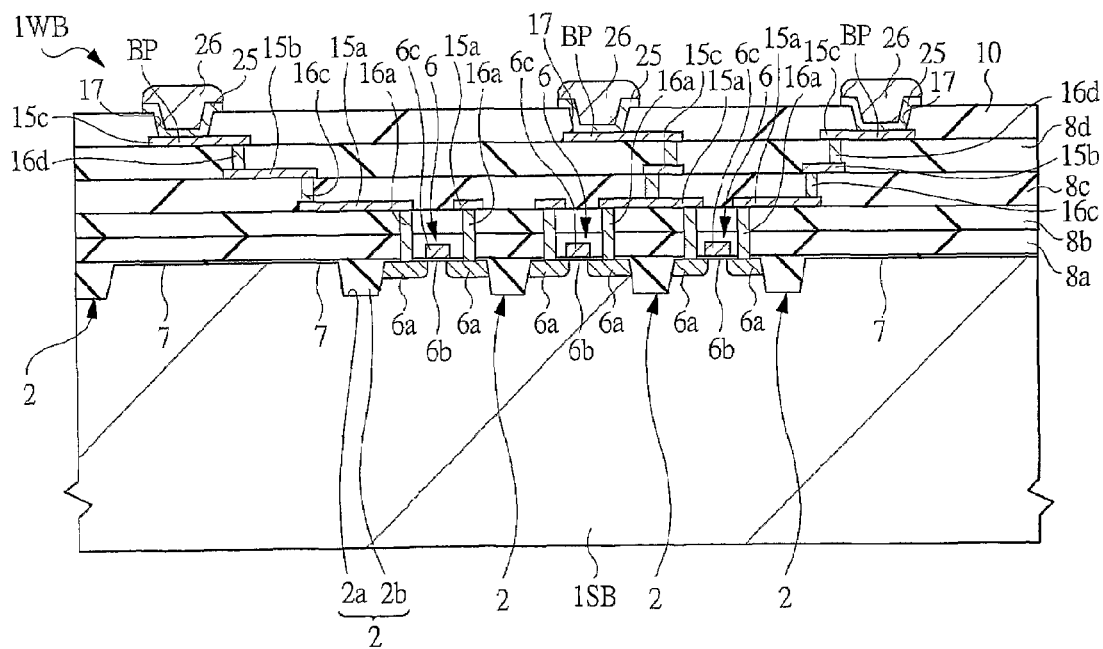
FIG. 16 is a cross-section view of the main parts of the lower wafer during the manufacturing process continued from FIG. 15.

Here, first, a conductive film is deposited through, for example, sputtering, on the main surface of the wafer 1WB after the step of manufacturing a multilayer interconnect layer 105B, and is then patterned by using lithography processing and etching, thereby forming under bump conductive patterns 25. Each of these under bump conductive patterns 25 is electrically connected to the pad BP through the opening 17. Then, as shown in FIG. 16, a bump 26 is formed on each under bump conductive pattern 25 through, for example, lift-off method, electrolytic plating, printing, or ball drop. As a result, the bump 26 is electrically connected to the uppermost interconnect layer 15c of the lower wafer 1WB. FIG. 16 is a cross-section view of the main parts of the lower wafer 1WB during the manufacturing process continued from FIG. 15. The main surface of the lower wafer 1WB has placed thereon a plurality of bumps 26 in a state of protrusion. In this manner, the process of manufacturing the lower wafer 1WB ends. The lower wafer 1WB has no insulating film deposited or no bump formed on the undersurface, and therefore the same effects as described above for the upper wafer 1WA can be achieved.

Figure 17:
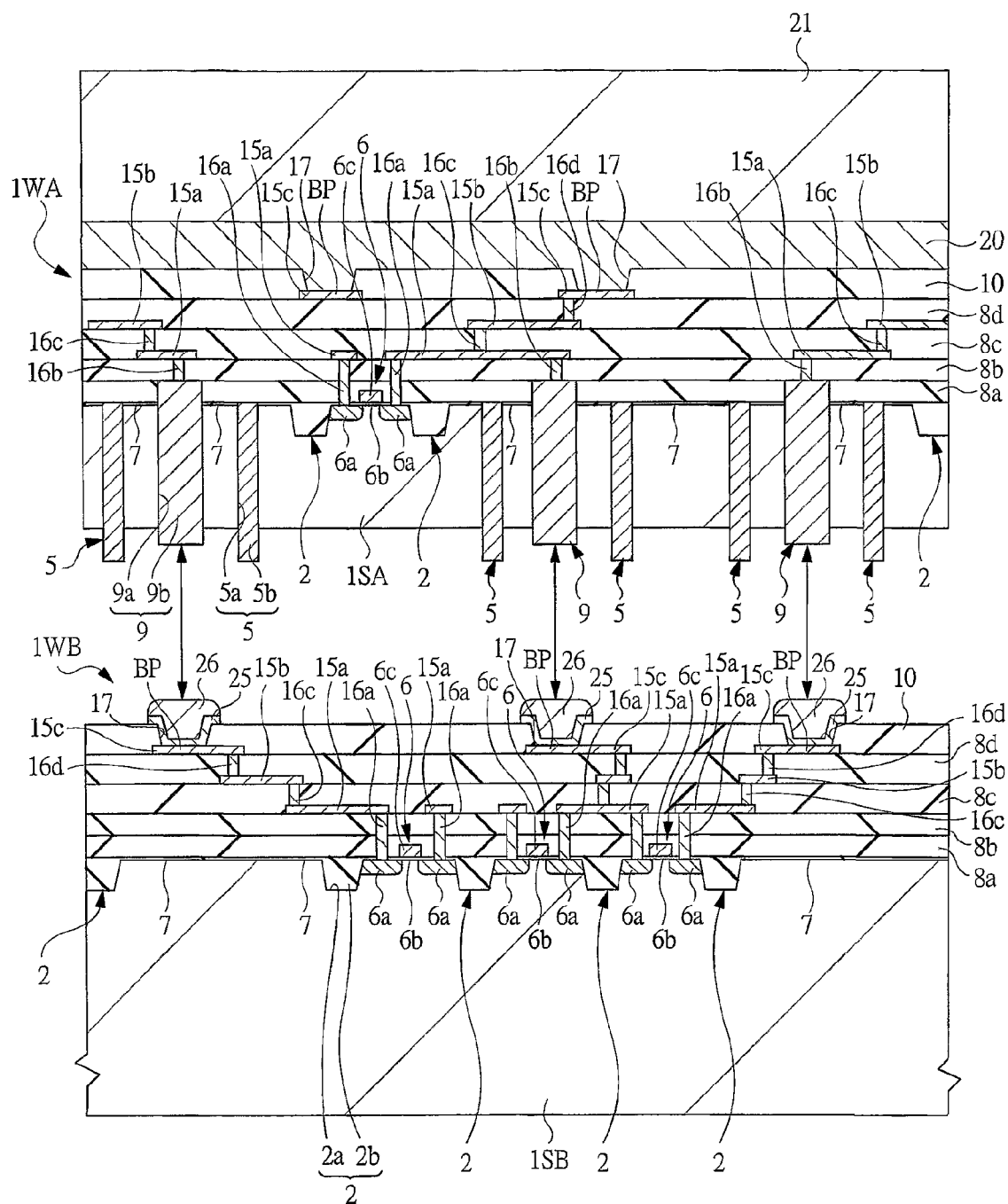
FIG. 17 is a cross-section view of main parts during a process of laminating the upper and lower wafers.
Figure 18:
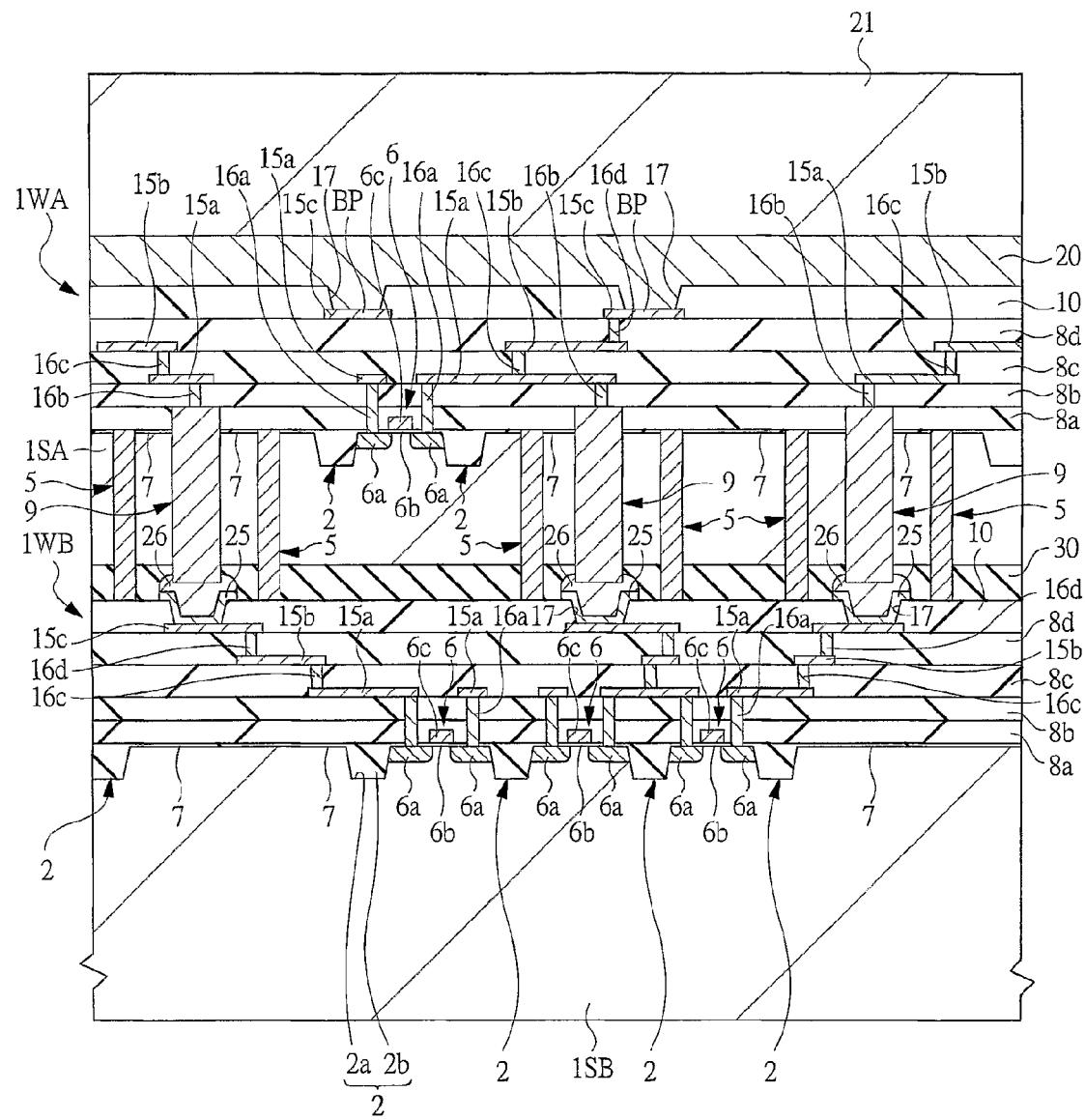
FIG. 18 is a cross-section view of the main parts during the process of laminating the upper and lower wafers continued from FIG. 17.
Figure 19:
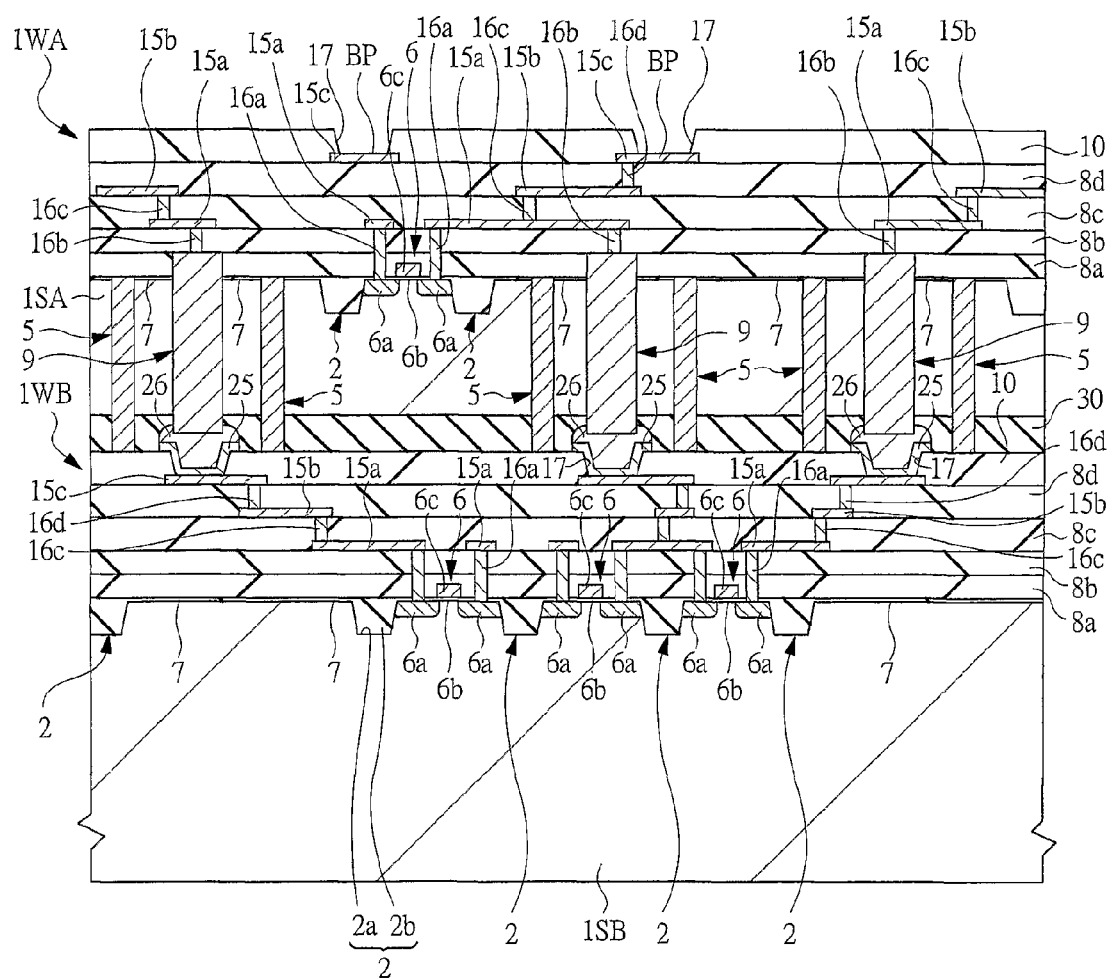
FIG. 19 is a cross-section view of the main parts during the process of laminating the upper and lower wafers continued from FIG. 18.

Next, a process of laminating the upper and lower wafers 1WA and 1WB manufactured in the manner described above is described with reference to FIGS. 17 to 19. FIGS. 17 to 19 are cross-section views of main parts during a process of laminating the upper and lower wafers 1WA and 1WB.

First, as shown in FIG. 17, after the lower wafer 1WB is fixed, the upper wafer 1WA is placed above the main surface of the lower wafer 1WB with the undersurface of the upper wafer 1WA facing the main surface of the lower wafer 1WB. At this time, the state is such that the glass supporting substrate 21 is laminated on the main surface of the upper wafer 1WA. With this, the thin wafer 1WA can be handled as being stabilized. Also, mechanical strength of the wafer 1WA can also be ensured. Therefore, the wafer 1WA can be handled without causing, for example, cracking, chipping, or warpage, on the wafer 1WA at the time of carrying the wafer 1WA.

Then, relative positions of the lower wafer 1WB and the upper wafer 1WA are aligned with each other. Specifically, the bumps 26 on the main surface of the lower wafer 1WB and the through interconnect portions 9 on the undersurface of the upper wafer 1WA are aligned with each other (step 201 in FIG. 2). Then, as shown in FIG. 18, facing surfaces of the upper and lower wafers 1WA and 1WB are brought close to each other to stack the upper wafer 1WA on the main surface of the lower wafer 1WB, thereby brining the bumps 26 on the main surface of the lower wafer 1WB and the through interconnect portions 9 on the undersurface of the upper wafer 1WA into contact with each other for electrical connection. With this, semiconductor circuit units of the upper and lower wafers 1WA and 1WB are electrically connected to each other. Here, each of the bumps 26 on the main surface of the lower wafer 1WB is within the frame of the through isolation portion 5 surrounding the through interconnect portion 9 on the undersurface of the upper wafer 1WA to which the bump 26 is connected (step 202 in FIG. 2).

Next, an adhesive 30 with insulation properties is injected in a gap between the facing surfaces of the upper and lower wafers 1WA and 1WB. With this, mechanical strength between the upper and lower wafers 1WA and 1WB is ensured. Here, an exemplary case is illustrated in which the adhesive 30 gets into even the frames of the through isolation portions 5. However, since the adhesive 30 with insulation properties is used, this case does not pose a problem to the characteristics of the device. Also, even in case of the upper and lower wafers 1WA and 1WB are in contact with each other at a thin portion due to crude density of the through interconnect portions 9, no inconvenience occurs in device characteristics (step 203 in FIG. 2). Then, as shown in FIG. 19, the glass supporting substrate 21 is delaminated from the main surface of the upper wafer 1WA.

After the processes as described above, the laminated wafers 1WA and 1WB are cut into chips. Each of these chips has a three-dimensional configuration such that a plurality of chips are laminated. That is, with semiconductor circuits of the respective chips forming one chip being electrically connected each other through the through interconnect portions 9, one desired semiconductor integrated circuit as a whole is formed on each chip.

Figure 20:
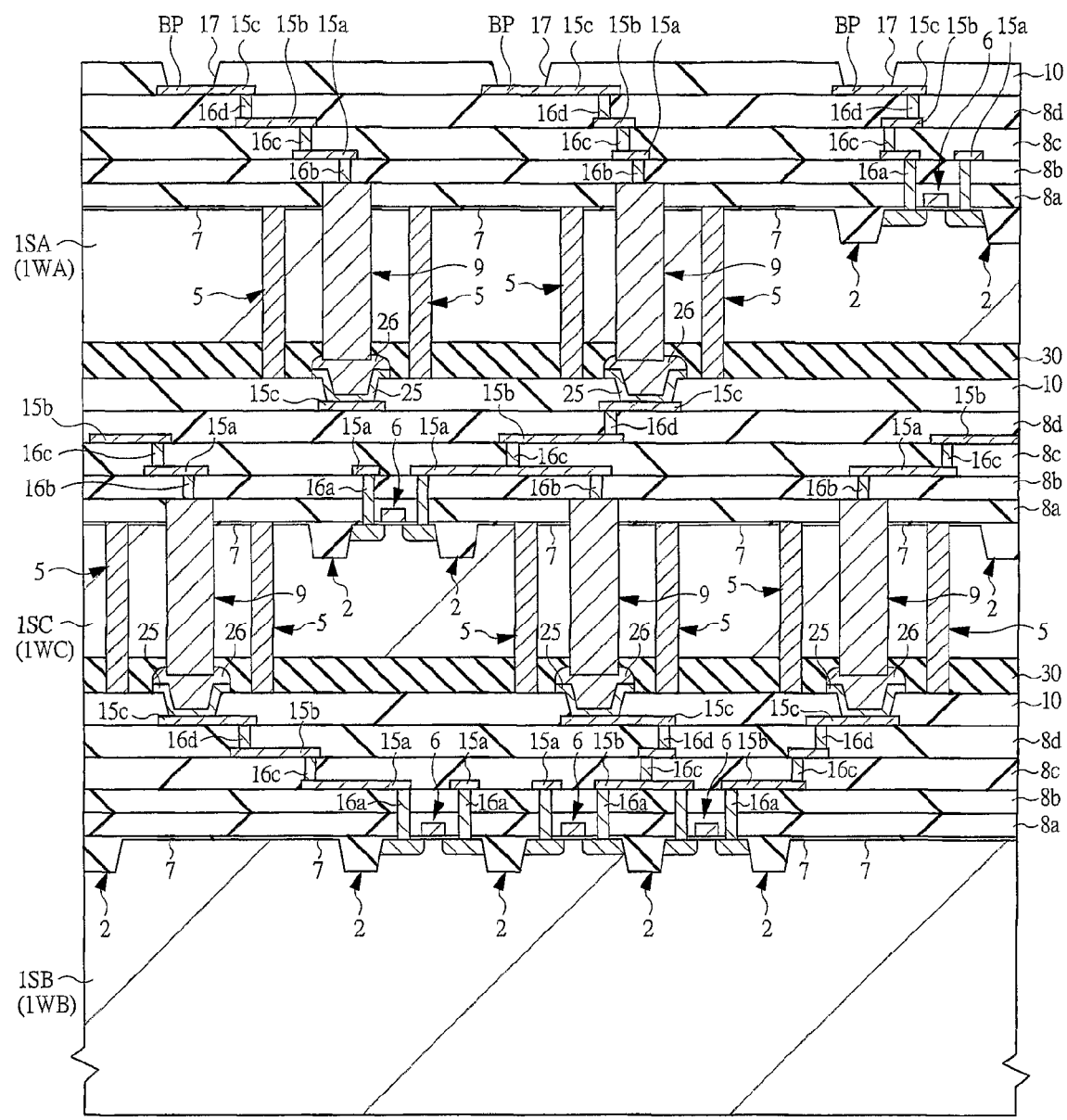
FIG. 20 is a cross-section view of a semiconductor device having a three-dimensional structure according to an embodiment of the present invention.

Next, FIG. 20 is an exemplary cross-section view of main parts of a semiconductor device having a three-dimensional structure formed by laminating three layers of substrates 1SA, 1SB, and 1SC. Here, an exemplary case is illustrated in which the adhesive 30 injected in a gap between the uppermost substrate 1SA and the intermediate substrate 1SC does not extend to the inside of the frame surrounded by the through isolation portion 5.

Here, an example of a process of manufacturing a three-dimensional semiconductor device in a multilayer laminated configuration as shown in FIG. 20 is described.

First, in a manner as described with reference to FIGS. 3 to 14, the wafer 1WA of the uppermost layer is prepared. Also, in a manner as described with reference to FIGS. 15 and 16, the wafer WB of the lowermost layer is prepared. Furthermore, through steps from 100B to 106B on the right side of FIG. 2, the wafer 1WC of the intermediate layer is prepared. On this wafer 1WC of the intermediate layer, as with the wafer 1WA of the uppermost layer, the through isolation portions 5 and the through interconnect portions 9 are formed. The wafer 1WC of the intermediate layer is different from the wafer 1WA of the uppermost layer in that the bumps 26 are formed on the main surface of the wafer 1WC of the intermediate layer through a interconnect layer. The bumps 26 of the wafer 1WC of the intermediate layer are electrically connected to elements and the through interconnect portions 9 of the wafer 1WC of the intermediate layer through the interconnect layer. Also, the wafer 1WC of the intermediate layer at this state has not yet been subjected to the first to third thinning processes, and therefore is still thick.

Then, in a manner as described with reference to FIGS. 17 and 18, two wafers 1WA and 1WC are laminated together. At this time, since the wafer 1WC of the intermediate layer is still thick, the wafer 1WC can be stably and easily handled. Then, with the glass supporting substrate 21 being kept laminated on the main surface of the wafer 1WA of the uppermost layer and further, with the two wafers 1WA and 1WC being kept laminated, the wafer 1WC of the intermediate layer located lower is made thinner from its undersurface through a thinning process as described with reference to FIGS. 13 and 14 (step 107A at the center in FIG. 2). With this, the through isolation portions 5 and the through interconnect portions 9 are exposed (protruded) from the undersurface of the wafer 1WC of the intermediate layer located lower. Since the wafer 1WC of the intermediate layer is made thinner with the two wafers 1WA and 1WC being kept laminated, mechanical strength of the wafer 1WC at the time of the thinning process can be ensured, and also the stability in handling of the wafer 1WC can be improved. Thus, thinning the wafer 1WC can be facilitated.

After that, with the glass supporting substrate 21 being kept laminated on the main surface of the wafer 1WA of the uppermost layer located upper and with the two wafers 1WA and 1WC being kept laminated, in a manner as described with reference to FIGS. 17 and 18, the wafer 1WC of the intermediate layer located lower and the wafer 1WB of the lowermost layer are stacked together, and then the adhesive 30 is injected between the wafers 1WC and 1WB for lamination (steps from 201 to 203 at the bottom of the center portion of FIG. 2). Thereafter, the processes are the same as described above, and are not described herein. When three or more wafers are laminated, the processes performed on the wafer 1WC of the intermediate layer and the wafer lamination process can be repeated.

According to such a wafer lamination method, lamination of a plurality of wafers can be successively and stably performed, thereby reducing the manufacturing time of three-dimensional semiconductor devices and improving mass productivity of three-dimensional semiconductor devices.

The present invention can be applied to three-dimensional semiconductor device manufacturing industries.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A semiconductor device composing a desired semiconductor circuit is configured by laminating a plurality of substrates and electrically connecting semiconductor circuit units formed on the respective substrates together, wherein
   an upper substrate of the plurality of substrates having:
   a main surface and an undersurface that are oppositely positioned along a thickness direction of the upper substrate;
   an element that is formed on the main surface of the upper substrate and configures the semiconductor circuit unit;
   a through interconnect portion penetrating from the main surface to the undersurface of the upper substrate and electrically connecting the semiconductor circuit units on the plurality of substrates together; and
   a through isolation portion that is provided at a position on the main surface of the upper substrate away from the through interconnect portion so as to surround the through interconnect portion and penetrates from the main surface through the undersurface of the upper substrate,
   a lower substrate of the plurality of substrates having:
   a main surface and an undersurface that are oppositely positioned along a thickness direction of the lower substrate;
   an element that is formed on the main surface of the lower substrate and configures the semiconductor circuit unit; and
   a bump that is formed on the main surface of the lower substrate and is electrically connected to the semiconductor circuit unit,
   the semiconductor circuit unit of the upper substrate and the semiconductor circuit unit of the lower substrate are electrically connected to each other by jointing the through interconnect portion exposed from the undersurface of the upper substrate to the bump on the main surface of the lower substrate, with the through interconnect portion and the bump being in contact with each other.

2. The semiconductor device according to claim 1, wherein the through isolation portion is formed by burying an insulating film in a hole penetrating from the main surface of the upper substrate through the undersurface thereof.

3. The semiconductor device according to claim 1, wherein the through interconnect portion is formed by burying an insulating film in a hole penetrating from an upper surface of the insulating film deposited on the main surface of the upper substrate through the undersurface of the upper substrate.

4. The semiconductor device according to claim 3, wherein a conductive film configuring the through interconnect portion is made of metal.

* * * * *